(12) United States Patent
Feller (10) Patent No.: US 8,300,758 B2
(45) Date of Patent: Oct. 30, 2012

(54) ADAPTIVE FILTER USING SHIFTED REVERSE INTERPOLATION

(75) Inventor: Marc Feller, Long Beach, CA (US)

(73) Assignee: Quantum Corporation, San Jose, CA (US)

( * ) Notice: Subject to any disclaimer, the term of this patent is extended or adjusted under 35 U.S.C. 154(b) by 450 days.

(21) Appl. No.: 12/695,389

(22) Filed: Jan. 28, 2010

(65) Prior Publication Data

US 2011/0182391 A1    Jul. 28, 2011

(51) Int. Cl.
*H04L 7/00*     (2006.01)

(52) U.S. Cl. ........ 375/371; 375/354; 375/316; 375/295; 375/232; 375/350; 375/348; 381/318; 381/59

(58) Field of Classification Search ................... 375/371, 375/354, 316, 295, 232, 233, 350, 348; 381/318, 381/59
See application file for complete search history.

(56) References Cited

U.S. PATENT DOCUMENTS

| | | | |
|---|---|---|---|
| 7,421,017 B2 | 9/2008 | Takatsu | |
| 2004/0071206 A1* | 4/2004 | Takatsu | ......................... 375/232 |

OTHER PUBLICATIONS

Carorso, T. et al., "Zeus Read Channel Specification," Quantum Product Document, pp. 40-53, Jun. 30, 2005.

Jibry, R., "Nikolayev Falcon Functional Definition," Hewlett Packard Manual, Document No. Controller-001079 : Rev 1.6, pp. 26-33, Jan. 15, 2008.
Orfanidis, S. J., *Optimum Signal Processing, An Introduction*, Part 1—Introduction through Chapter 1, 1998.
Orfanidis, S. J., *Optimum Signal Processing, An Introduction*, Part 2—Chapter 2 through Chapter 4, 1998.
Orfanidis, S. J., *Optimum Signal Processing, An Introduction*, Part 3—Chapter 5, 1998.
Orfanidis, S. J., *Optimum Signal Processing, An Introduction*, Part 4—Chapter 6 through Chapter 7, 1998.
Orfanidis, S. J., *Optimum Signal Processing, An Introduction*, Part 5—Appendix through Index, 1998.
Wu, Z., *Coding and Iterative Detection for Magnetic Recording Channels*, 2000.

* cited by examiner

*Primary Examiner* — Zewdu Kassa
(74) *Attorney, Agent, or Firm* — Baker Botts L.L.P.

(57) ABSTRACT

In one embodiment, an apparatus comprises an adaptive filter, a timing recovery unit, and a reverse interpolation filter. The adaptive filter has adaptive filter coefficients that are adjusted based on a first error signal at a first sample rate and filters a first signal at the first sample rate to obtain a second signal at the first sample rate. The timing recovery unit interpolates the second signal at the first sample rate to obtain a third signal at a second sample rate; and estimates a partial response signal at the second sample rate corresponding to the third signal. The a reverse interpolation filter interpolates a second error signal at the first sample rate, which is a difference between the third signal and the partial response signal, to obtain the first error signal at the first sample rate for feeding back to the adaptive filter.

18 Claims, 11 Drawing Sheets

ADAPTIVE FILTER USING SHIFTED REVERSE INTERPOLATION

TECHNICAL FIELD

The present disclosure generally relates to adaptive digital filters and, more specifically, relates to re-sampling a lower bit-rate signal at a higher bit rate to obtain a feedback signal to an adaptive digital filter.

BACKGROUND

An adaptive filter is a filter that self-adjusts its transfer function according to an optimizing algorithm. Most adaptive filters are digital filters that perform digital signal processing and adapt their performance based on the input signals. An adaptive filter has adaptive filter coefficients. Adaptive filters are especially suitable to those applications where some parameters of the desired signal processing operation are not known in advance. Such applications commonly employ adaptive filters that use feedback to refine the values of their adaptive filter coefficients and hence their frequency responses. In general, the adapting process involves the use of a cost function, which is a criterion for optimum performance of the adaptive filter, to feed an optimizing algorithm, which determines how to modify the adaptive filter coefficients to minimize the cost of the next iteration.

There are various implementations of the adaptive filters, including, for example, Least Mean Squares (LMS) filter and Recursive Least Squares (RLS) filter. A LMS filter uses least mean squares algorithms to find the adaptive filter coefficients that relate to producing the least mean squares of the error signal, which is the difference between the desired signal and the actual signal. It may be considered a stochastic gradient descent method in that the filter is adapted based on the error at the current time. A RLS filter uses recursive least squares algorithms to find the filter coefficients that relate to recursively producing the least squares (i.e., the minimum of the sum of the absolute squared) of the error signal. In some instances, the filter coefficients of an adaptive filter may be adjusted based at least in part on feedback signals to the adaptive filter.

Adaptive filters are routinely used in devices such as mobile telephones, digital cameras, camcorders, medical monitoring equipments, or tape drives for various purposes such as noise cancellation, signal prediction, adaptive feedback cancellation, or echo cancellation.

SUMMARY

The present disclosure generally relates to adaptive digital filters and more specifically relates to re-sampling a lower bit-rate signal at a higher bit rate to obtain a feedback signal to an adaptive digital filter.

In particular embodiments, an apparatus comprises an adaptive filter, a timing recovery unit, and a reverse interpolation filter. The adaptive filter has adaptive filter coefficients that are adjusted based on a first error signal at a first sample rate. The adaptive filter is operable to filter a first signal at the first sample rate to obtain a second signal at the first sample rate. The timing recovery unit is coupled to the adaptive filter. The timing recovery unit is operable to interpolate the second signal at the first sample rate to obtain a third signal at a second sample rate; and estimate a partial response signal at the second sample rate corresponding to the third signal. The reverse interpolation filter is coupled to the timing recovery unit. The reverse interpolation filter is operable to interpolate a second error signal at the first sample rate, which is a difference between the third signal and the partial response signal, to obtain the first error signal at the first sample rate for feeding back to the adaptive filter.

In particular embodiments, the reverse interpolation filter comprises a control unit operable to provide a first control signal that controls each sample interval at the first sample rate during which the interpolation of the second error signal occurs and a second control signal that identifies a timing offset within each sample interval at the first sample rate at which the interpolation of the second error signal occurs; and a first interpolator operable to re-sample the second error signal at the first sample rate to obtain the first error signal at the first sample rate according to the first control signal and the second control signal.

These and other features, aspects, and advantages of the disclosure are described in more detail below in the detailed description and in conjunction with the following figures.

DETAILED DESCRIPTION

The present disclosure is now described in detail with reference to certain example embodiments thereof as illustrated in the accompanying drawings. In the following description, numerous specific details are set forth in order to provide a thorough understanding of the present disclosure. It is apparent, however, to one skilled in the art, that the present disclosure may be practiced without some or all of these specific details. In other instances, well known process steps and/or structures have not been described in detail in order not to unnecessarily obscure the present disclosure. In addition, while the disclosure is described in conjunction with the particular embodiments, it should be understood that this description is not intended to limit the disclosure to the described embodiments. To the contrary, the description is intended to cover alternatives, modifications, and equivalents as may be included within the spirit and scope of the disclosure as defined by the appended claims.

Figure 1:
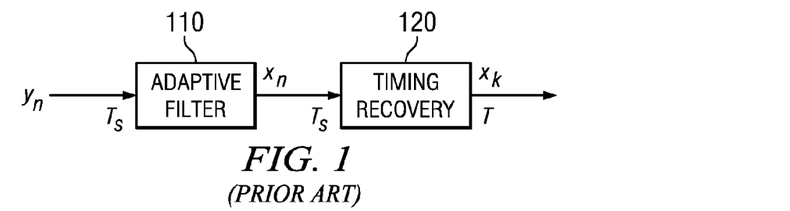
FIG. 1 (prior art) illustrates an example application of an adaptive filter in connection with a timing recovery unit.

An adaptive filter is a filter that self-adjusts its transfer function according to an optimizing algorithm. Adaptive filters may be used in may types of devices. FIG. 1 illustrates an adaptive filter 110 coupled to a timing recovery unit 120. The circuit illustrated in FIG. 1 may be used, among other components, in disk, tape, optical, or other digital data recovery channels in which an adaptive filter (e.g., adaptive filter 110) may act on over-sampled data (i.e., data sampled at higher bit rates) in order to minimize an error signal.

In particular embodiments, adaptive filter 110 may be a digital Finite Impulse Response (FIR) filter, where the filter's impulse response to a Kronecker delta input signal settles to zero in a finite number of sample intervals. In particular embodiments, FIR filter 110 may operate at a sampling interval, denoted as $T_s$, somewhat shorter than the cell interval, denoted as T, of the data in order to provide a degree of margin for speed variations. In particular embodiments, because FIR filter 110 operates on the interval $T_s$ rather than the interval T, it may be properly called a Fractionally-Spaced Equalizer (FSE). The FSE consists of a tapped delay line that stores samples from the input signal. In particular embodiments, timing recovery unit 120 may be an Interpolated Timing Recovery (ITR) unit, which is illustrated in more detail in FIG. 2.

Figure 2:
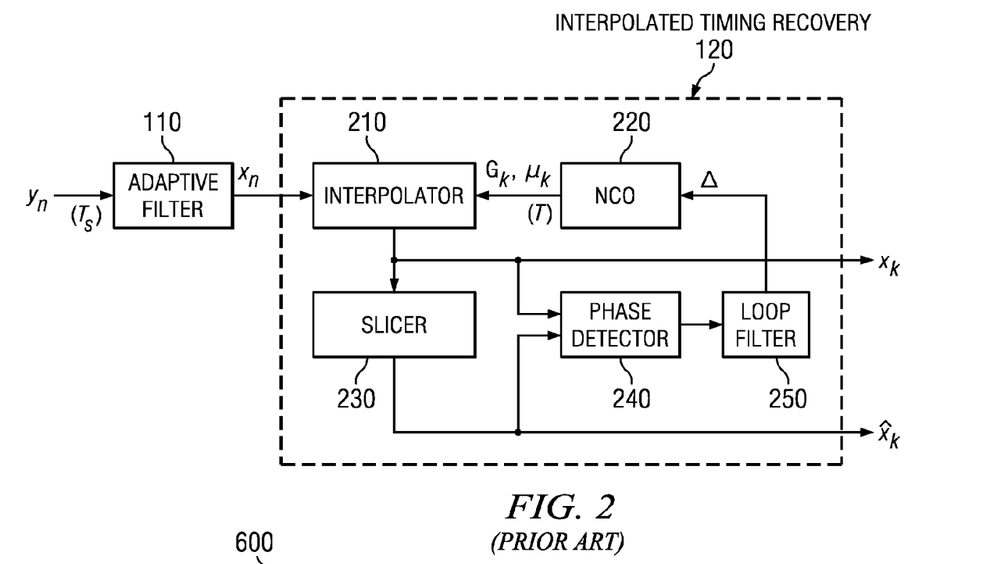
FIG. 2 (prior art) illustrates an example structure of the timing recovery unit illustrated in FIG. 1.

In particular embodiments, ITR 120 may include an interpolator 210, a Numerically-Controlled Oscillator (NCO) 220, a slicer 230, a phase detector 240, and a loop filter 250. In particular embodiments, interpolator 210 may be a polynomial interpolator or a FIR interpolator designed by the windowed-sinc method. In particular embodiments, interpolator 210 down samples $x_n$, to obtain $x_k$. In particular embodiments, slicer 230 estimates a partial response signal based on the interpolated noisy signal. More specifically, slicer 230 estimates an ideal value $x_k$, denoted as $\hat{x}_k$. Thus, $x_k$ is the actual interpolated signal, and $\hat{x}_k$ is the estimated ideal signal. In particular embodiments, phase detector 240 outputs a phase error signal characterizing the phase error between the interpolated signal and the estimated partial response signal. In particular embodiments, loop filter 250, which may be proportional, integral, or a combination of the two, smoothes the phase error signal. In particular embodiments, NCO 220, responsive to the smoothed error signal, provides two control signals, $G_k$ and $\mu_k$, which are connected to the interpolator so as to provide it with control signals. $G_k$ determines whether or not an interpolation is to be made in the current cycle, having a positive value when an interpolation is to be made and a value of zero when an interpolation is not to be made; and $\mu_k$ determines the offset into the current cycle in which the interpolation, if any, is to be made.

For clarification purposes, the input signal to adaptive filter 110 is denoted as $y_n$, and the output signal from adaptive filter 110 is denoted as $x_n$, which becomes the input signal to timing recovery unit 120. In addition, the output signal from timing recovery unit 120 is denoted as $x_k$ and $\hat{x}_k$ where $x_k$ is the interpolated (i.e., the actual, down-sampled) sample values and $\hat{x}_k$ is the ideal (i.e., the estimated) sample values corresponding to $x_k$.

In particular embodiments, ITR 120 may obtain signal samples, $x_k$, from the output signal samples of FSE 110, $x_n$, which becomes the input signal samples to ITR 120, at a lower bit rate than that of the output signal samples of FSE 110 by means of interpolation (i.e., down sampling) using interpolator 210. That is, the bit rate of $x_k$ is lower than the bit rate of $x_n$. In particular embodiments, ITR 120 may re-sample $x_n$ at exactly the cell interval (i.e., T). The over-sampling ratio, defined as $$\frac{T}{T_s},$$

typically ranges from approximately 1.05 to approximately 1.5 but may in principle have any value greater than unity.

In particular embodiments, interpolator 210 may be capable of re-sampling the input signal data $x_n$ to ITR 120 at intervals of T. The re-sampled data are referred to as $x_k$ and occur at intervals T instead of $T_s$, as do $x_n$. That is, $x_n$ occur at intervals $T_s$, while $x_k$ occur at intervals T. Thus, this re-sampling is down sampling. In particular embodiments, the re-sampling instants may be determined by NCO 220, driven in turn by the filtered phase error, denoted as $\Delta$, of $x_k$. NCO 220 may issue a gate, denoted as G, in each $T_s$ cell in which an interpolation is to be made, together with an offset, denoted as $\mu_k$, specifying the time within the cell at which the interpolation should take place. In particular embodiments, if an interpolation is not to be made in the current cell the gate G is not issued and the offset may be equal to the previous offset $\mu_{k-1}$. In particular embodiments, the phase error may be obtained using a decision-directed method, that is, as a function of the difference between each interpolated sample $x_k$ and its corresponding ideal value $\hat{x}_k$.

In particular embodiments, adaptive filter (FSE) 110 may serve to perform wave-shaping of the input signal $y_n$ to transform it into a suitably good approximation of the target waveform $x_n$. Particular embodiments my assume that before operations begin, FSE 110 may be loaded with a set of "seed" filter coefficients capable of delivering a reasonable approximation to the ideal response. In particular embodiments, these may be obtained from the input signal in an off-line manner, as, for example, by means of the autocorrelation method described in Orfanidis, Sophocles J., "*Optimum Signal Processing*", Second Edition, MacMillan, 1988, Section 5.14. In particular embodiments, FSE 110 may also suppress signal energy above $$\frac{1}{T};$$

that is, FSE 110 may serve as an anti-aliasing filter. In the case that the input signal $y_n$ is already band-limited, FSE 110 may still avoid introducing energy above $$\frac{1}{T}.$$

In particular embodiments, the filter coefficients of FSE 110 may be chosen in various ways and may be fixed or adaptive. In the latter case where the filter coefficients are adaptive, there may arise choices between different error estimation and adaptation algorithms. With the signed LMS method, which corresponds to linear interpolation, the error signal may be obtained using the difference between $x_k$ and its estimated $\hat{x}_k$. Since the error, defined as $e_k = x_k - \hat{x}_k$ (EQUATION 1), is generated in the T sampling domain, linear interpolation into the succession of error samples may be employed to obtain the estimated error, denoted as $\hat{e}_n$, to drive the adaptation algorithm in the $T_s$ domain. Further, no error is generated during those $T_s$ cells in which no interpolation is made.

Digital data recovery channels generally receive over-sampled data; that is, data sampled at a rate $T_s$ slightly higher than the bit rate to allow for speed variations in the source. An adaptive filter (e.g., FSE 110) may be used to equalize the over-sampled data before it is delivered to a timing recovery unit (e.g., ITR 120). However, direct extraction of an error signal in the over-sampled domain $T_s$ is not possible, so the adaptive filter must be trained using an error signal fed back from the bit rate domain T following the timing recovery unit. Conventional approaches have employed either direct feedback of the error signal or linear interpolation from the T domain back to the $T_s$ domain, but these methods are suboptimal and introduce errors into the training.

The present disclosure employs a reverse interpolation filter, also referred to as a reverse interpolator or re-sampler, which estimates the error signal values from the $T_s$ domain from the error signal values from the T domain with higher precision. In particular embodiments, the reverse interpolation filter is driven by a control unit receiving interpolated values from the timing recovery unit (e.g., ITR 120). This approach ensures a valid sample in every $T_s$ interval by shifting the points at which the interpolation is made. More specifically, in particular embodiments, the output of an adaptive digital fractionally-spaced equalizer operating on over-sampled data drives an interpolated timing recovery unit. The ITR obtains bit-rate signal samples from the output of the FSE by means of an interpolator (i.e., a down sampler). A reverse interpolator (i.e., an up sampler) estimates an error signal from the cell-rate samples. The filter coefficients of the FSE are adjusted using the error-signal estimates so as to minimize the mean squared error. The reverse interpolator is driven by a control unit that shifts the reverse interpolation interval depending on the number of over-sampled points in each bit-rate cell so that an interpolation is made in every over-sampled cell.

Figure 3:
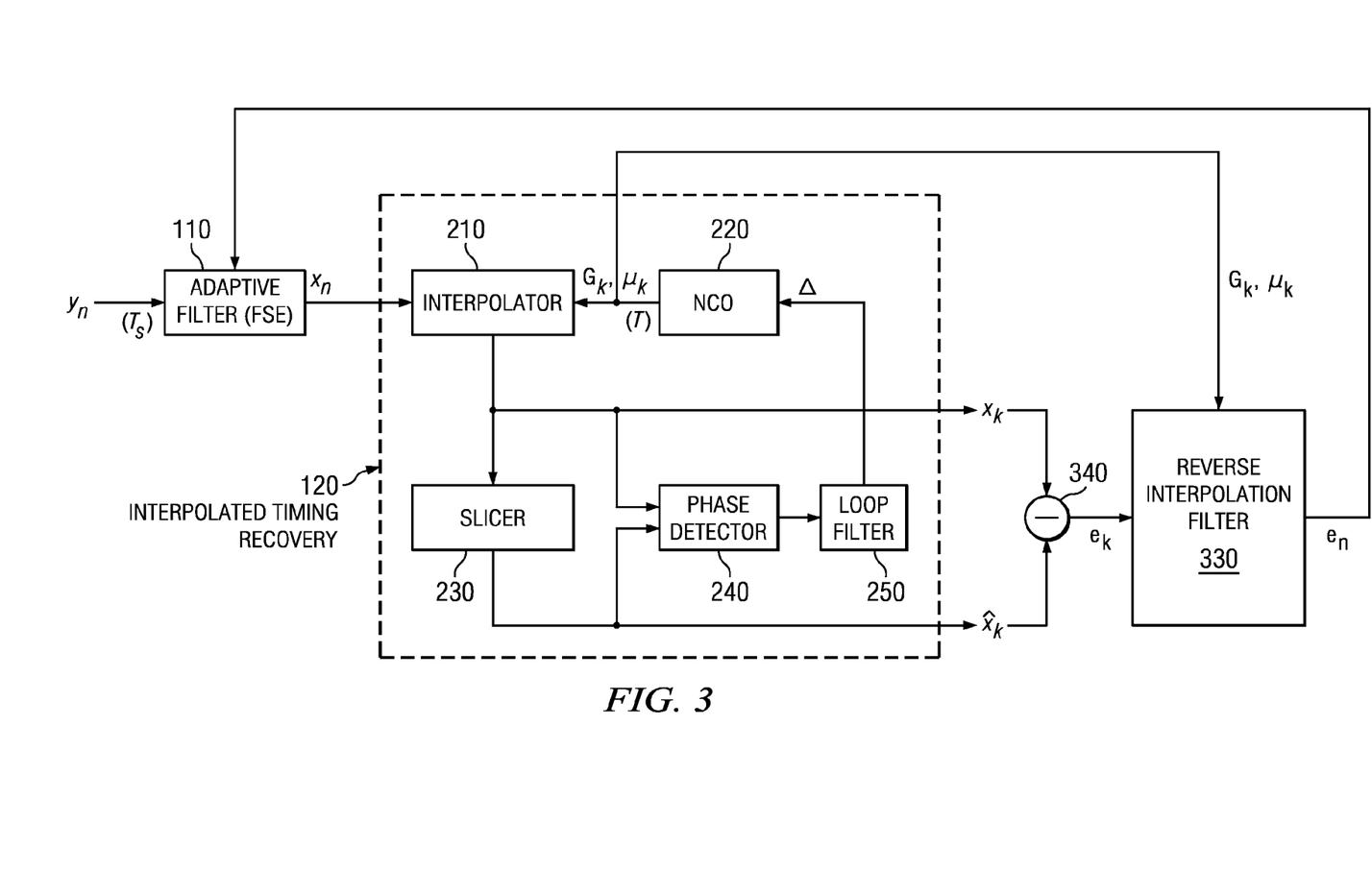
FIG. 3 illustrates an example of an adaptive filter in connection with a timing recovery unit in connection with a reverse interpolation filter.

FIG. 3 illustrates an example of a FSE 110 in connection with an ITR 120 in connection with a reverse interpolation filter 330 for generating the error $e_n$ in the T sampling domain. Reverse interpolation filter 330 may also be referred to as reverse interpolator or re-sampling interpolator or re-sampler. FSE 110 and ITR 120 are similar to those components illustrated in FIG. 2. In particular embodiments, the difference between the down sampled $x_k$ and its corresponding ideal value $\hat{x}_k$ from ITR 120 is determined using a subtractor 340. This difference is $e_k$ as defined in EQUATION 1. The input to reverse interpolation filter 330 includes $e_k$ from subtractor 340 and $G_k$ and $\mu_k$ from NCO 220. In particular embodiments, $G_k$ indicates when to perform the reverse interpolation for the current cell (i.e., the timing of the reverse interpolation) and $\mu_k$ indicates where in the current cell to perform the reverse interpolation (i.e., the offset within the current cell at which the reverse interpolation is performed). Note that the current cell refers to the current cell from FSE 110. In particular embodiments, reverse interpolation filter 330 reverse interpolates (i.e., up samples) $e_k$ at the cell and timing offset within the cell controlled by $G_k$ and $\mu_k$ respectively to obtain $e_n$, which is fed back to FSE 110 to be used to adjust the filter coefficients of FSE 110.

Particular embodiments discard signed LMS and instead, construct a system based on the Widrow-Hoff gradient descent algorithm described in Orfanidis, Sophocles. J., "*Optimum Signal Processing*", Second Edition, MacMillan, 1988, Section 7.3. Particular embodiments generate an error sample in every $T_s$ cell. Per the Widrow-Hoff gradient descent algorithm, particular embodiments update the coefficient vector h at time n+1 by h(n+1)=h(n)+2βe$_n$y$_n$ (EQUATION 2), where β is a constant determining the rate of adaptation, y$_n$ is the vector of samples (i.e., the input samples to FSE 110 as illustrated in FIG. 2), and $e_n$ is the error at time n. Different embodiments may choose between generating the error $e_n$ in either the T or $T_s$ sampling domain. In the former case, particular embodiments may interpolate into the sequence $e_k$, and in the latter case, particular embodiments may re-sample the succession of ideal target values $\hat{x}_k$ at intervals of $T_s$ to produce the sequence $\hat{x}_n$, and then form the error $e_n = x_n - \hat{x}_n$ (EQUATION 3) at the output of FSE 110.

Figure 4:
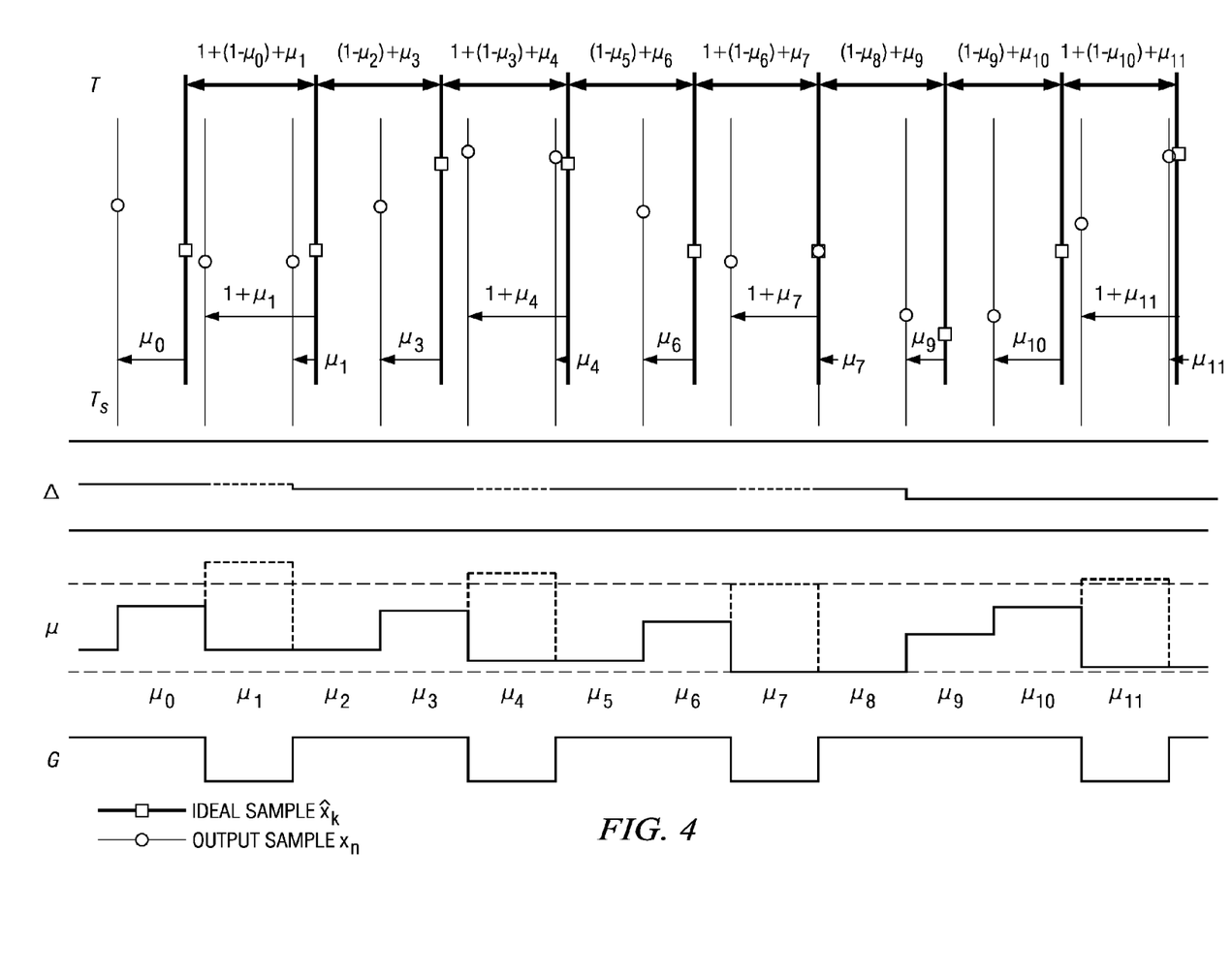
FIG. 4 illustrates an example of re-sampling error signal from an Interpolated Timing Recovery (ITR) unit.

The following describes the implementation of generating the error in the T sampling domain in more detail. In particular embodiments, re-sampling of either $e_n$ or $\hat{x}_k$ at the appropriate instants may be preformed using the succession of timing offsets $\mu_k$ from NCO 220. To do so, in particular embodiments, it is necessary to normalize the $\mu_k$, originating in the T domain, with respect to the $T_s$ domain. An example situation is illustrated in FIG. 4, showing output samples $x_n$ of FSE 110 using thinner lines and the ideal samples $\hat{x}_k$ (at the cell boundaries) using thicker lines, and where for convenience of exposition, $T_s$ is set to 1 and T is set to 1.5. Also illustrated in FIG. 4 are the commands Δ to NCO 220, the timing offsets $\mu_k$, and the gate signals $G_k$. The durations of the $\hat{x}_k$ cells with respect to the $T_s$ domain are illustrated along the top and are the values which normalize the $\mu_k$. The thinner arrows show the offsets into the bit cells at which the ideal equalizer samples occur in the T (non-normalized) domain.

Inspection of FIG. 4 reveals that there are two general cases for the re-sampling operation, depending on whether the G signal is present or absent in the current $T_s$ cell. These cases correspond respectively, for example, to $T_s$ cells $\mu_3$ and $\mu_4$ in FIG. 4. In the first case, G is present and one interpolation is made into the current cell using $\mu_3$ normalized by $(1-\mu_2)+\mu_3$. In the second case, G is absent, signifying that there are two values of $T_s$ in the cell. Thus, two interpolations should be made, one with $\mu_4$ and one with 1+$\mu_4$, both normalized by 1+$(1-\mu_3)+\mu_4$. The dual interpolation is necessary due to the absence of a gate, and therefore the absence of an interpolated value of $\hat{x}_k$ during the $T_s$ cell.

Since the re-sampling interpolator (e.g., reverse interpolation filter 330) acts on the $\mu_k$, it is reasonable to suppose that it is of the same kind as the ITR interpolator (e.g., interpolator 210). Thus, for example, if a polynomial interpolator is used for ITR 120, a polynomial interpolator of identical degree should be used for reverse interpolation filter 330. In particular embodiments, both interpolator 210 and reverse interpolator 330 are FIR interpolators designed, for example, by the windowed-sinc method.

Further inspection of FIG. 4 shows that it is necessary to keep a record of previous values of $\mu_k$ and $G_k$, because interpolation takes place using a succession of samples and therefore the interpolation instant occurs later than the instant at which the $\hat{x}_k$ are entered into reverse interpolator 330. In particular embodiments, one structure that accomplishes this consists of three registers of length L, one for each of $\hat{x}_k$, $\mu_k$, and $G_k$ and all clocked at intervals of $T_s$. Thus, a complete record of L samples of all three signals is maintained. However, the register containing the $\hat{x}_k$ samples would contain gaps corresponding to the instants in which G is zero. These values may not be used for interpolation and it may be necessary to collect the valid remaining values in some way in order to present them to reverse interpolation filter 330.

Consequently, particular embodiments may enter information into the $\hat{x}_k$ register (and incidentally the $\mu_k$ register as well) only when G is true (e.g., non-zero). All successive values of $\hat{x}_k$ are then adjacent in the $\hat{x}_k$ register, and only relevant values of $\mu_k$ appear in the $\mu_k$ register. The record of the $G_k$ is still needed, however, and if that register is clocked by G itself it would contain only ones. A way around the problem, in particular embodiments, is to present the $G_k$ register not with the $G_k$ but with $z^{-1}G_k$ where $z^{-1}$ is a unit delay. Then, if the $G_k$ register is clocked with G, it will contain a zero corresponding to any cell that is preceded by G=0. This method is only valid as long as G=0 never occurs twice or more in a row, but in practice, this should not occur in a properly-functioning ITR output.

Figure 5:
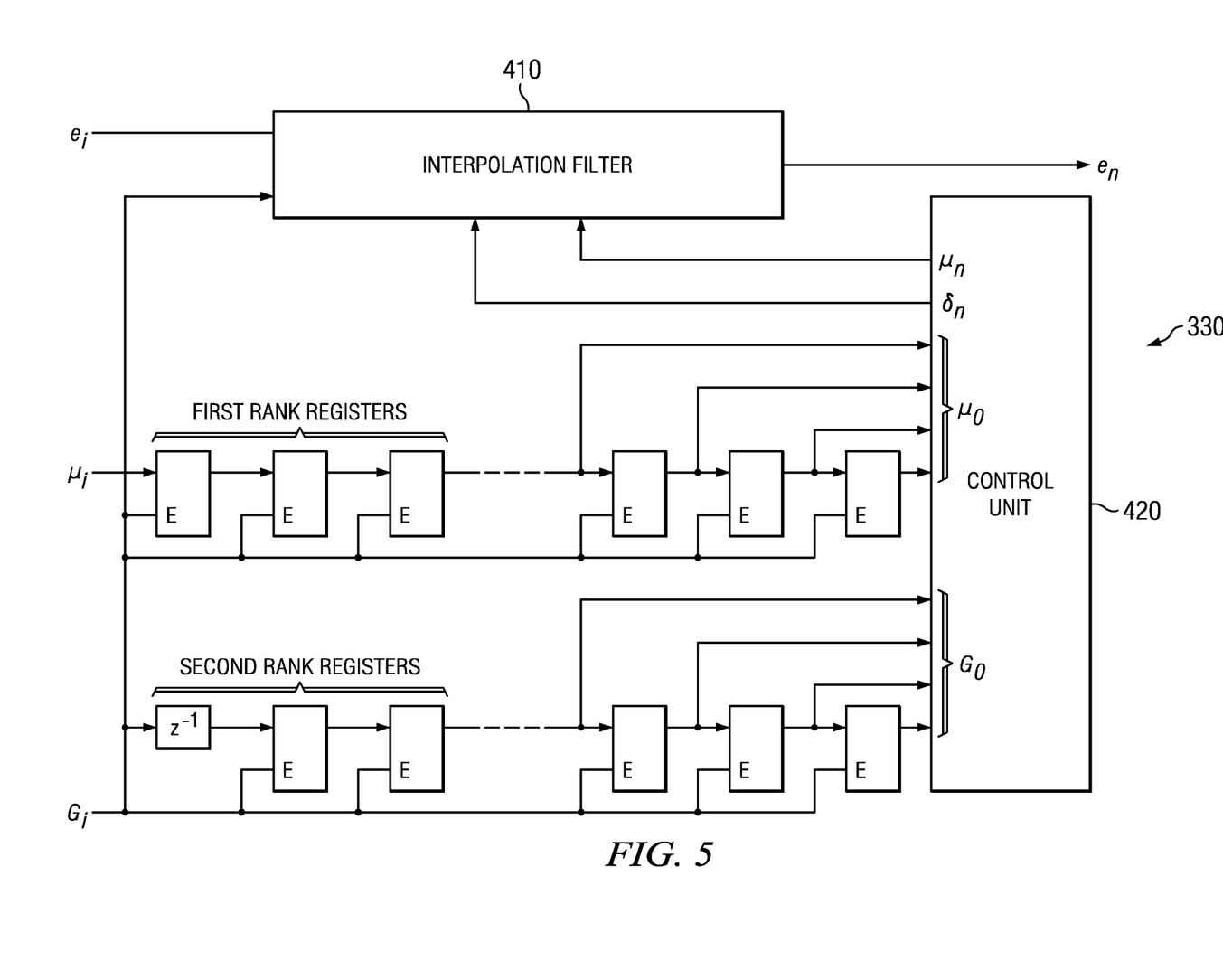
FIG. 5 illustrates an example of a reverse interpolation filter (also referred to as a re-sampler or reverse interpolator).

FIG. 5 illustrates an example structure of a reverse interpolation filter (e.g., reverse interpolation filter 330). The input $\mu_i$ to the first rank registers is the succession of $\mu_k$ from NCO 220, and the input $G_i$ to the second rank registers is the succession of gates $G_k$. In particular embodiments, the first and second rank registers include memories for storing successive values of $\mu_k$ and $G_k$. In particular embodiments, outputs from these registers are applied to a control unit 420 producing the interpolation offset $\mu_n$ and an integer delay, denoted as $\delta_n$. In particular embodiments, control unit 420 receives the outputs of the first and second rank registers, $\mu_o$ and $G_o$, and provides control signal $\mu_n$ that identifies a time offset within the current cell at the lower bit-rate, and control signal $\delta_n$ that identifies the current cell for interpolation. These values are applied to interpolation filter 410, whose input $e_i$ is the succession of errors $e_k$ and which is also clocked by the $G_k$. Interpolation filter 410 up-samples $e_k$ to obtain $e_n$, which is then fed back to FSE 110.

In particular embodiments, the function of the delay $\delta_n$ is to select the succession of samples which are to be interpolated in the current cycle. On the one hand, suppose that the value of G leaving the register (delivered to control unit 420) is zero for a particular cycle, so that, as illustrated in FIG. 4, two successive interpolations should be made on the same data. If the value of G entering the register is one, however, the data will be shifted before the second interpolation can take place. Consequently, interpolation filter 410 should be shifted right on the second cycle to bring the data back into alignment. On the other hand, under certain circumstances when the entering value of G is zero, it is necessary to move the filter to the left. In particular embodiments, the correct value of $\delta_n$ may be determined by introducing an auxiliary variable $F = \overline{G_o + z^{-1}F}$ (EQUATION 4), where the over bar indicates NOR, together with the rule given in the following TABLE 1. Here, $G_o$ and $G_i$ refer to the output and input, respectively, of the $G_k$ register, and the variable F is nonzero if and only if the current value of $G_o$ and the previous value of F are both zero. It may be seen that $\delta_n$ is equal to the previous value $\delta_{n-1}$ except when F and $G_i$ are both nonzero, in which case the previous value is increased by one; or, when either $G_o$ is nonzero and $G_i$ is zero or $G_o$ and $G_i$ are both zero and $z^{-1}F$ is true, in either of which cases said previous value is decreased by one. In this manner $\delta_n$ is caused to track the succession of signals in the $G_k$ register so as to determine the reverse interpolation cell into which the current interpolation is to be made. In particular embodiments, the values of $\mu_o$ and $G_o$, which control the reverse interpolation (i.e., up sampling), must themselves move along with the filter. This is why there are multiple taps on the $\mu_k$ and $G_k$ registers in FIG. 5.

TABLE 1

| $z^{-1}F$ | $G_o$ | $G_i$ | F | $\delta_n$ |
|---|---|---|---|---|
| 0 | 0 | 0 | 1 | $\delta_{n-1}$ |
| 0 | 0 | 1 | 1 | $\delta_{n-1} + 1$ |
| 0 | 1 | 0 | 0 | $\delta_{n-1} - 1$ |
| 0 | 1 | 1 | 0 | $\delta_{n-1}$ |
| 1 | 0 | 0 | 0 | $\delta_{n-1} - 1$ |
| 1 | 0 | 1 | 0 | $\delta_{n-1}$ |
| 1 | 1 | 0 | 0 | $\delta_{n-1} - 1$ |
| 1 | 1 | 1 | 0 | $\delta_{n-1}$ |

Figure 6:
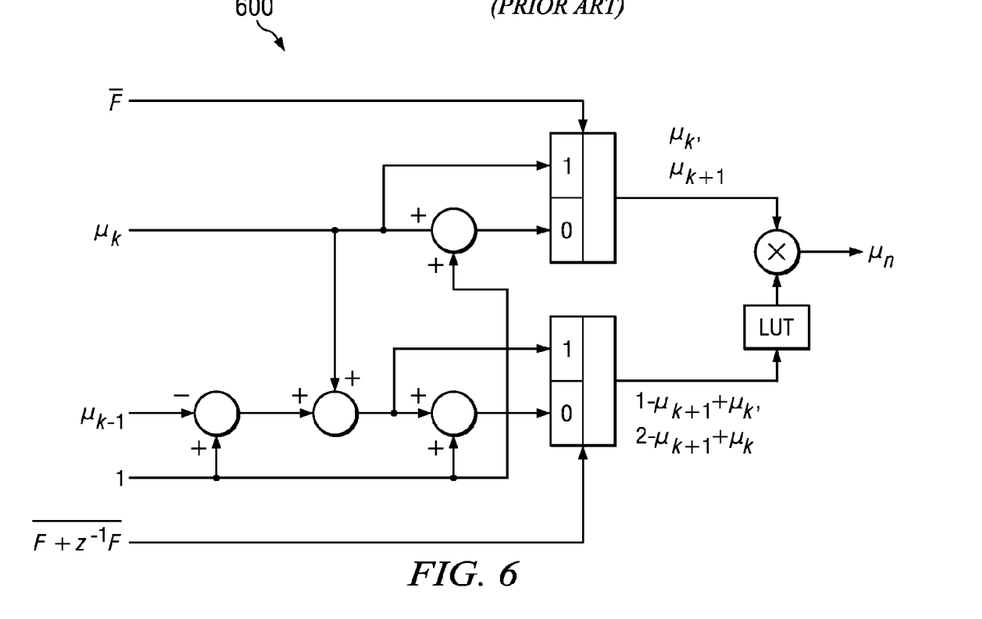
FIG. 6 illustrates an example offset calculator included in a reverse interpolation filter.

FIG. 6 illustrates an example of an offset calculator 600 suitable to be included in a reverse interpolation filter (e.g., reverse interpolation filter 330) for calculating the values of $\mu_k$. In particular embodiments, the inputs $\mu_k$, $\mu_{k+1}$ are selected by the current value of $\delta_n$. The upper path selects the numerator, and the lower path selects the denominator, based on EQUATION 4. In particular embodiments, a lookup table inverts the denominator and its output is applied to a multiplier producing the values of $\mu_k$.

Figure 7:
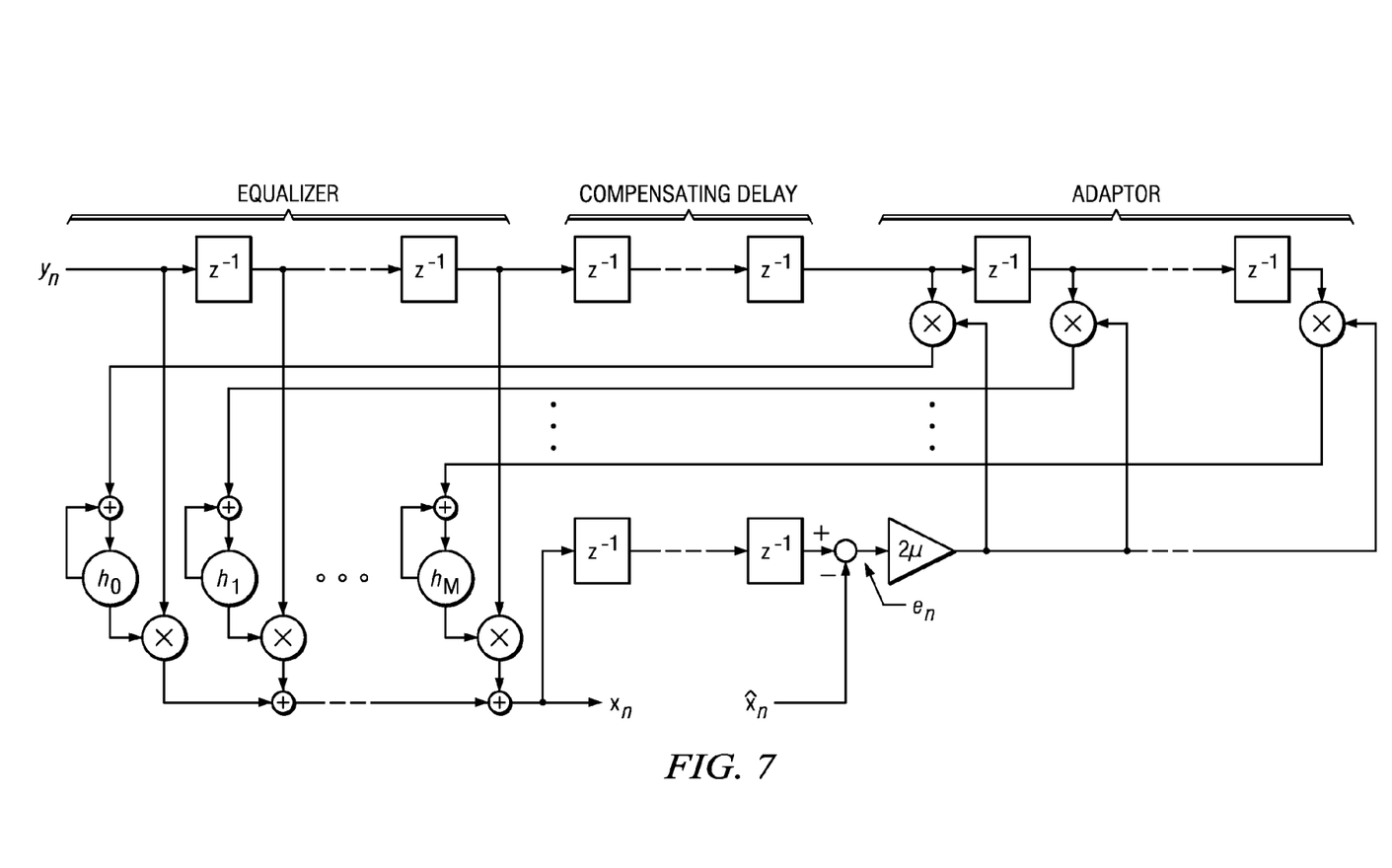
FIG. 7 illustrates an example of adaption with delay matching.

In particular embodiments, the adaptation algorithm involves adjustment of each tap weight as a function of the tap value and the error. Delays through the forward and reverse interpolators cause misalignment of the tap values with the errors and need to be compensated. Consequently, in particular embodiments, the updated tap weights are computed on saved tap values, as illustrated in FIG. 7, where the compensating delays equal the combined delays through the timing recovery unit (e.g., ITR 120). The upper delay saves the tap values and the lower delay saves the output of the adaptive filter (e.g., FSE 110) from which the error term is calculated. The latter is then applied to the saved tap values to obtain the weight updates.

Figures 8A, 8A:
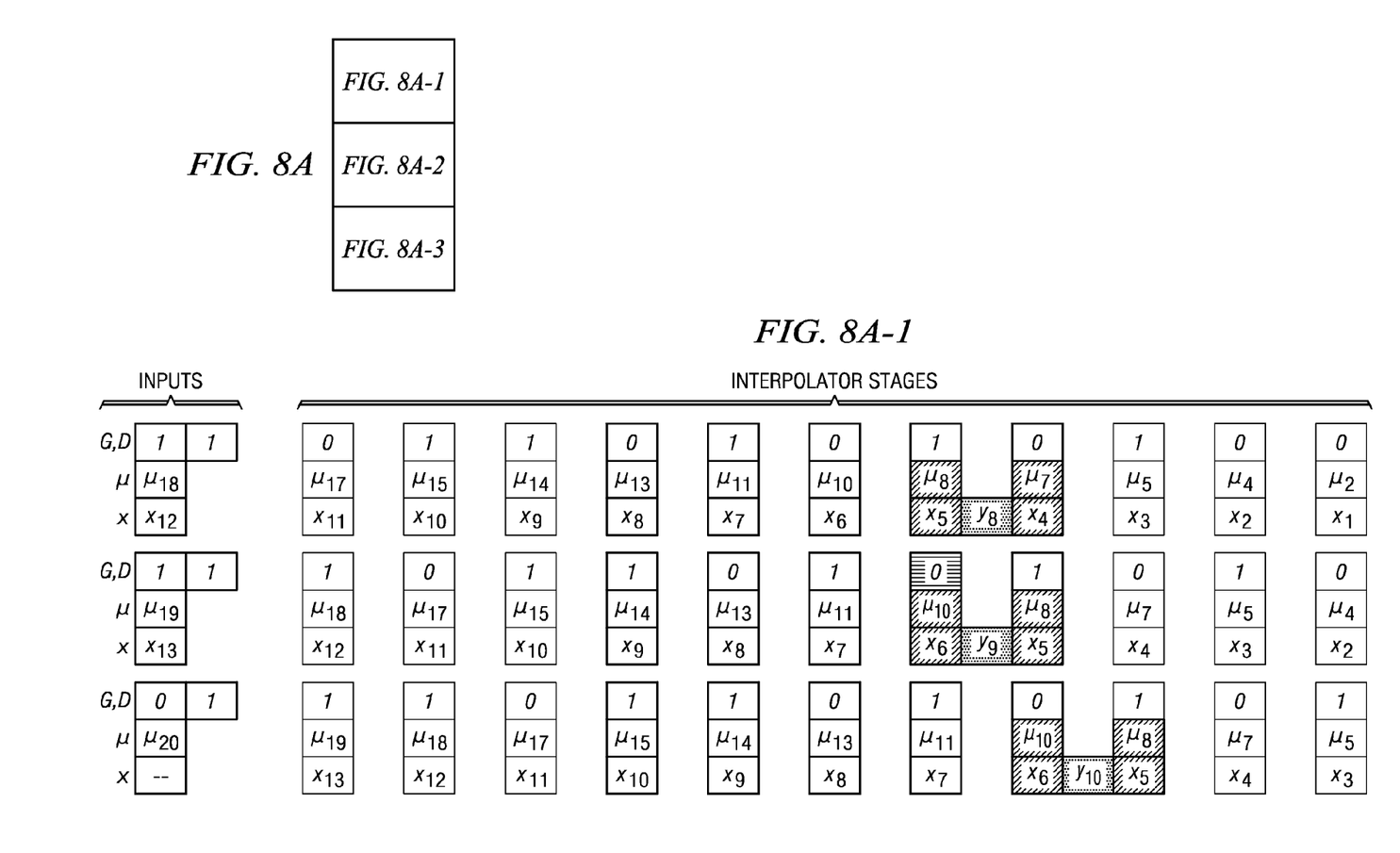
FIGS. 8A and 8B illustrate an example of the reverse interpolation process.
Figure 8A:
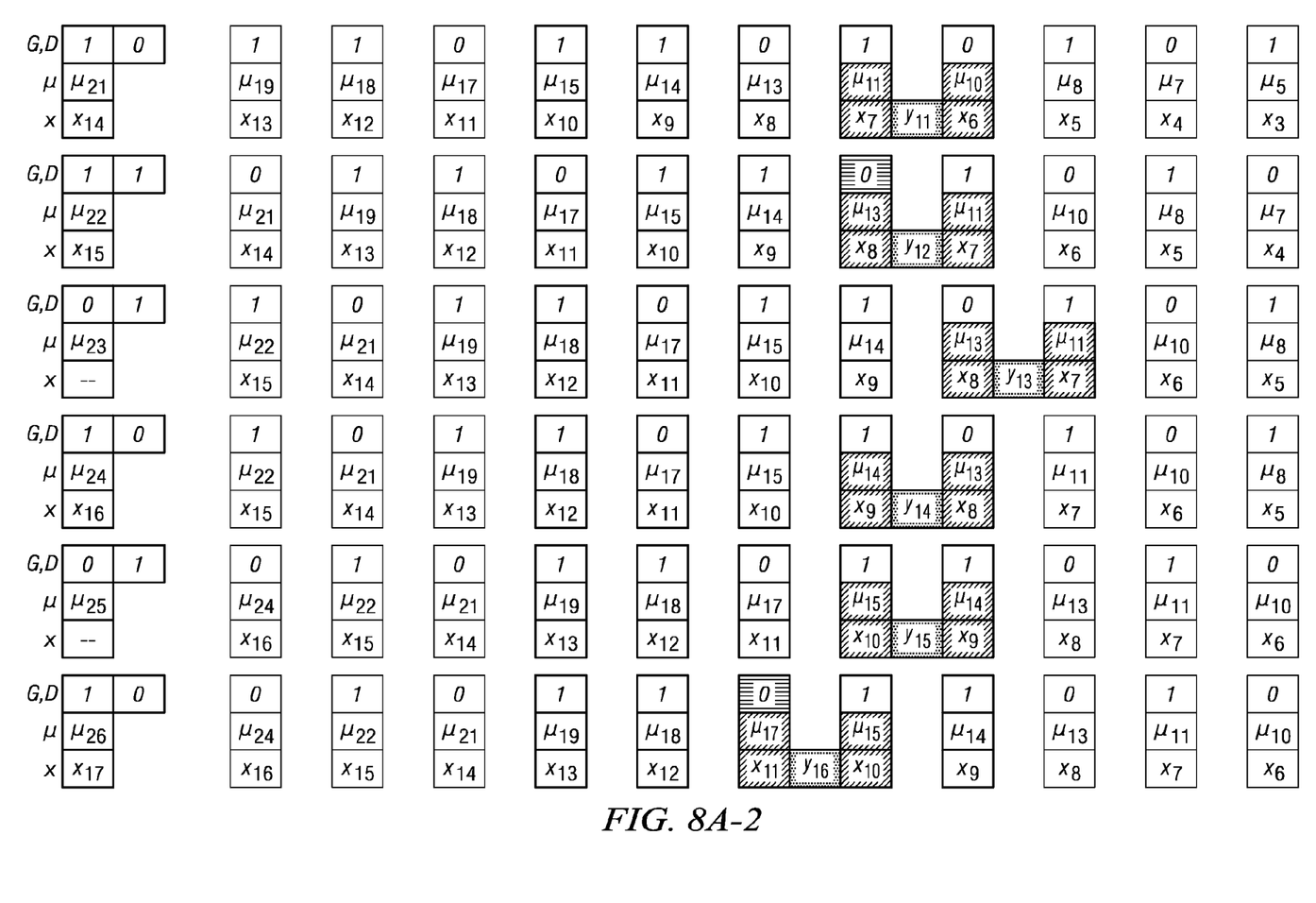
Figure 8A:
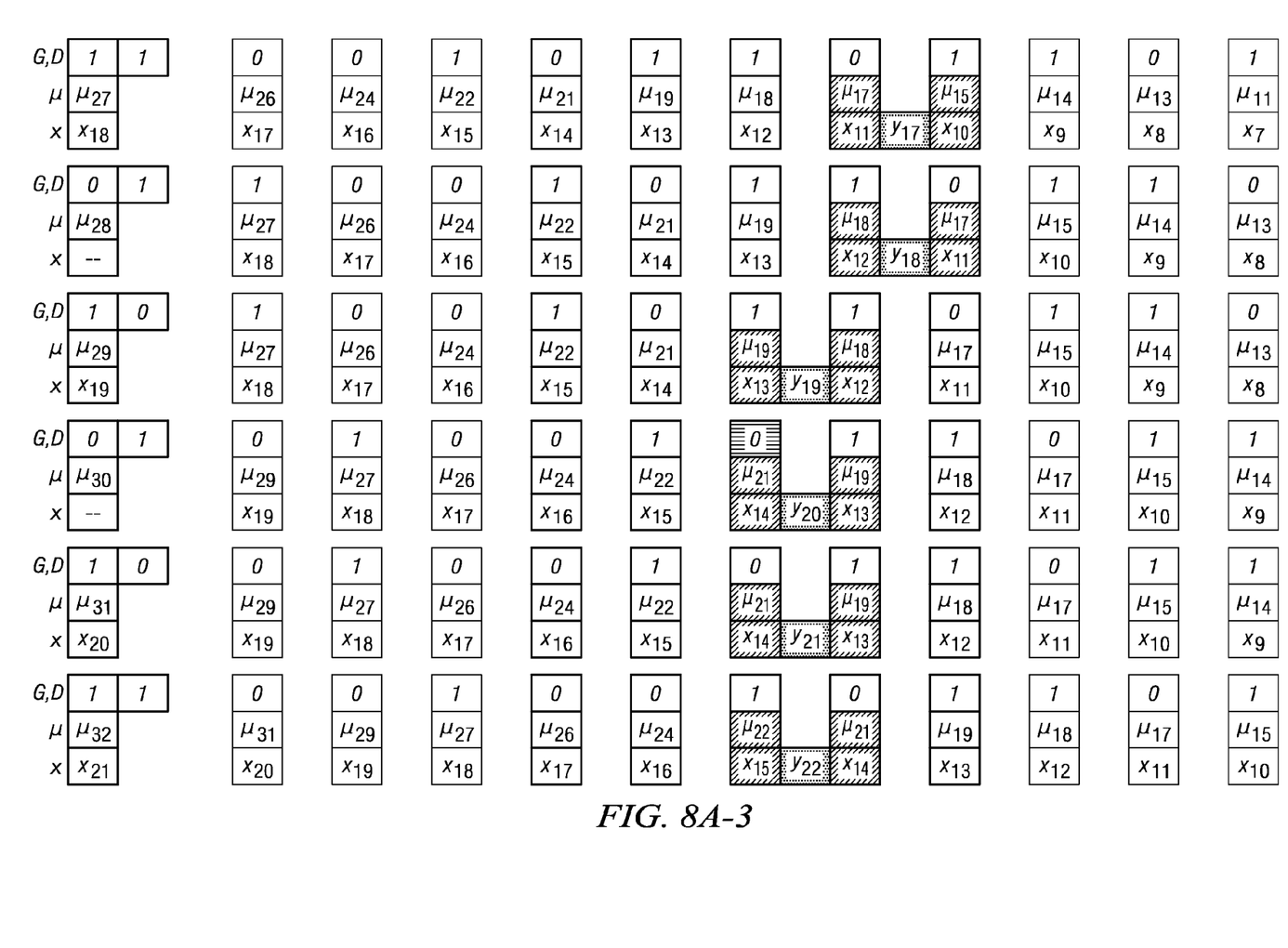
Figures 8B, 8B:
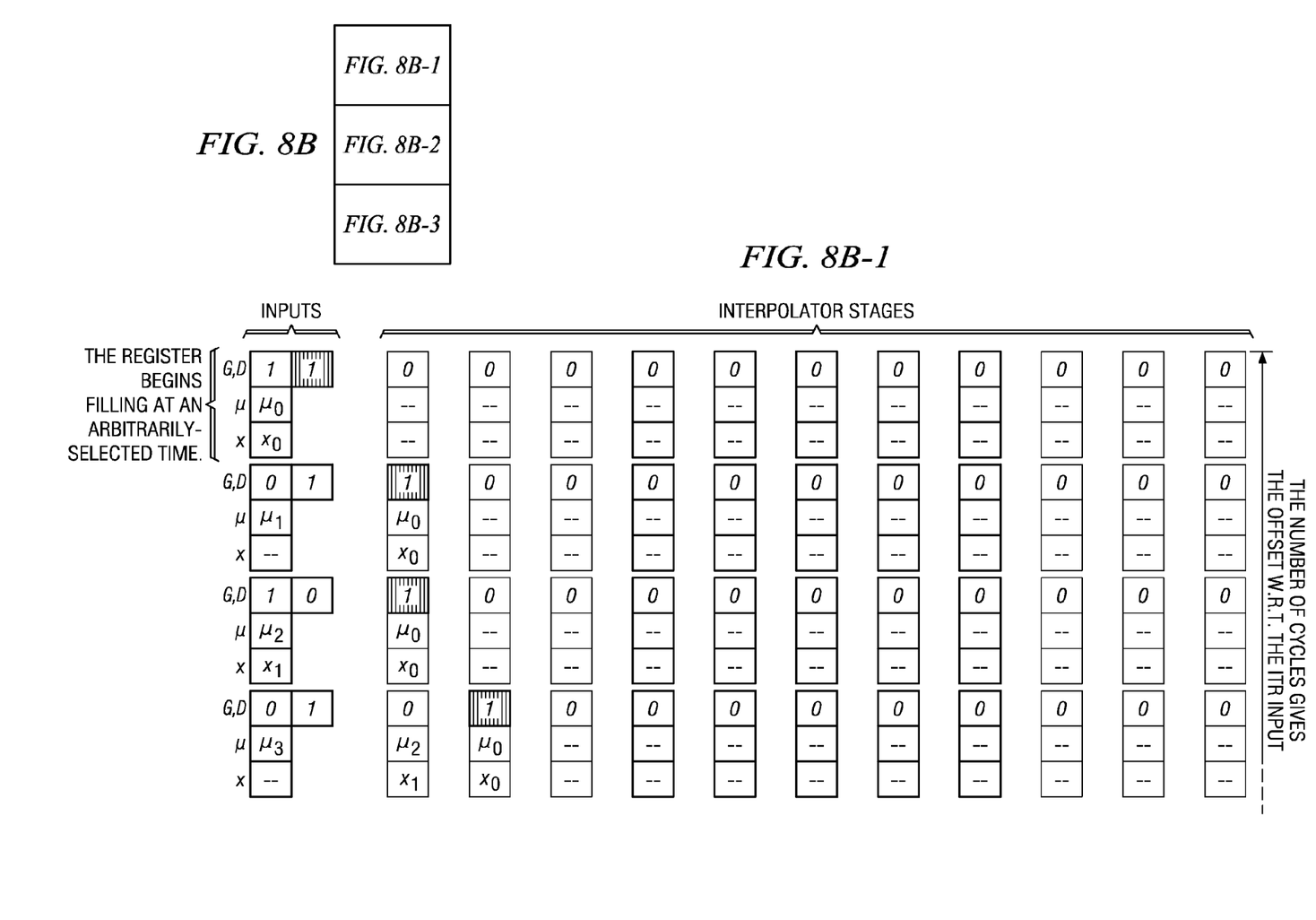
Figure 8B:
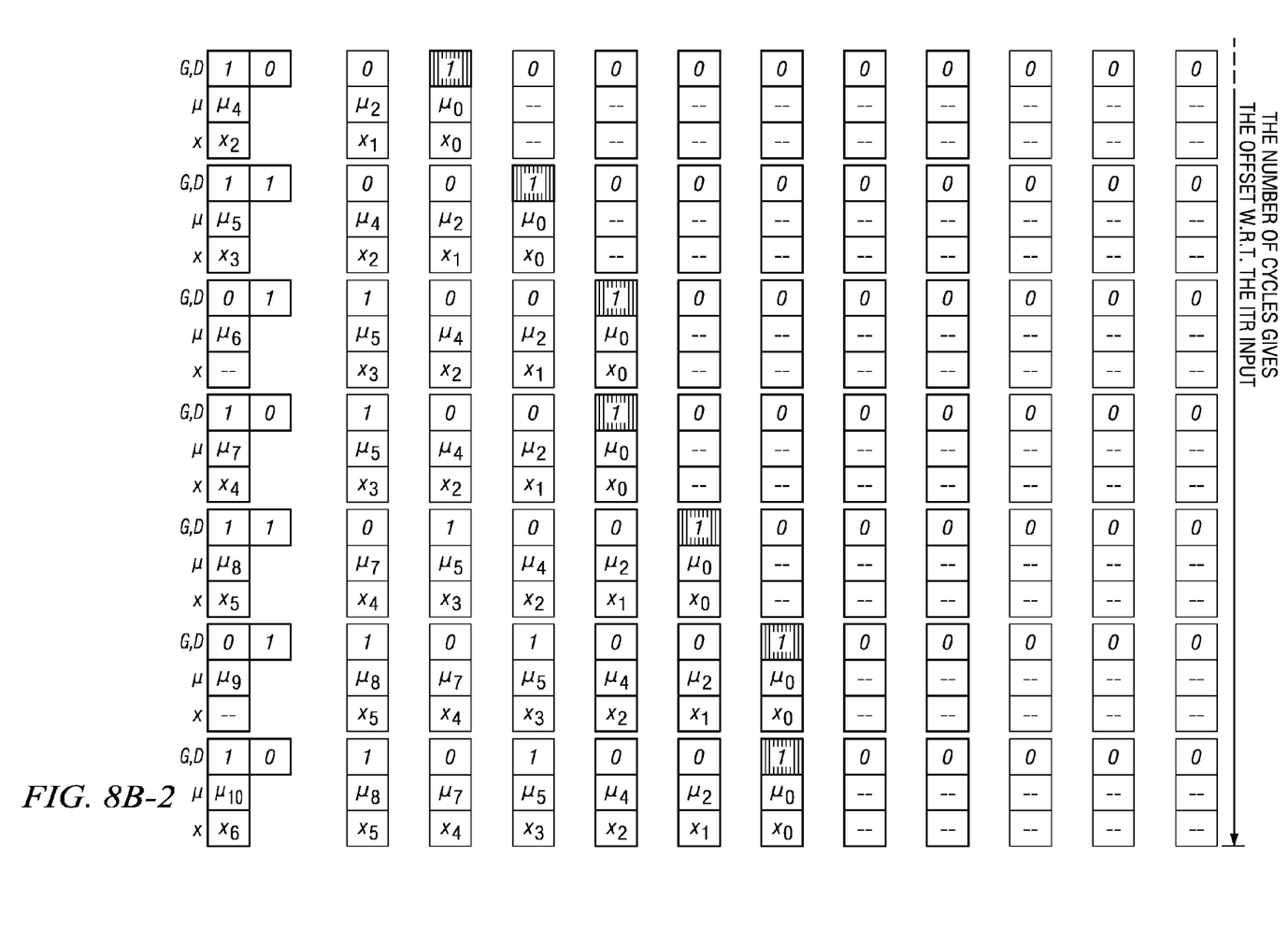
Figure 8B:
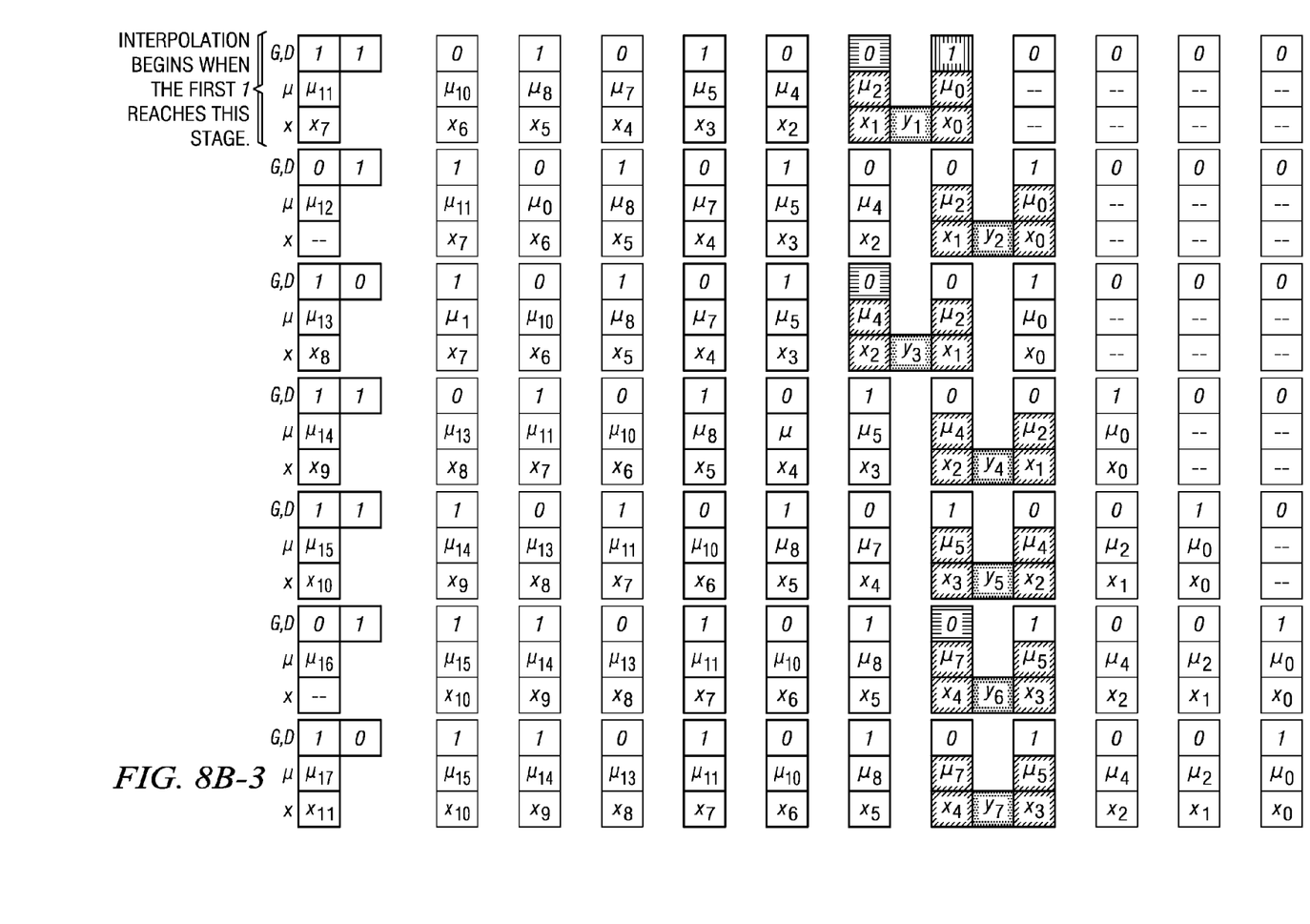

FIGS. 8A and 8B illustrate an example of the reverse interpolation process using the structure of FIG. 5 for a reverse interpolation filter and employing the example data of FIG. 4. The horizontal rows are the stages of the reverse interpolation filter with inputs G, D (current and previous gate signals), $\mu$, and x. The shaded blocks beginning in row 12 of FIGS. 8A and 8B show the interpolated values y as they are shifted around in the interpolator to accommodate the varying inputs.

Embodiments of the present disclosure produce a high-quality training signal to the down-sampling adaptive filter (e.g., FSE) instead of an error-prone direct feedback or linearly-interpolated signal, and the training signal is delivered in every $T_s$ cell. Both factors contribute to faster, more stable, and more accurate adaptation.

The components included in the filters or the timing recovery unit may be implemented as software, firmware, hardware, or a combination thereof. For example, the FSE, the ITR, and the reverse interpolation filter may each be implemented as Integrated Circuits (ICs) using suitable designs such as, for example, Filed-Programming Gate Array (FPGA), Application-Specific Instruction-Set Processor (ASIP), ASIC, or Complex Programmable Logic Device (CPLD). Functional logic may be embedded in such ICs so that each component may perform the necessary operations (e.g., ITR may be programmed to down sample data samples, and reverse interpolation filter may be programmed to up sample data samples).

It will be appreciated that, for clarification purposes, the above description describes particular embodiments with reference to different functional units and processors. However, it will be apparent that any suitable distribution of functionality between different functional units, processors, or domains may be used without detracting from the disclosure. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization. Additionally, although a feature may appear to be described in connection with particular embodiments, one skilled in the art would recognize that various features of the described embodiments may be combined in accordance with the invention.

Although the present disclosure describes or illustrates particular operations as occurring in a particular order, the present disclosure contemplates any suitable operations occurring in any suitable order. Moreover, the present disclosure contemplates any suitable operations being repeated one or more times in any suitable order. Although the present disclosure describes or illustrates particular operations as occurring in sequence, the present disclosure contemplates any suitable operations occurring at substantially the same time, where appropriate. Any suitable operation or sequence of operations described or illustrated herein may be interrupted, suspended, or otherwise controlled by another process, such as an operating system or kernel, where appropriate. The acts can operate in an operating system environment or as stand-alone routines occupying all or a substantial part of the system processing.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. An apparatus comprising:
an adaptive filter having adaptive filter coefficients that are adjusted based on a first error signal at a first sample rate, wherein the adaptive filter is operable to filter a first signal at the first sample rate to obtain a second signal at the first sample rate;
a timing recovery unit coupled to the adaptive filter, wherein the timing recovery unit is operable to:
interpolate the second signal at the first sample rate to obtain a third signal at a second sample rate; and
estimate a partial response signal at the second sample rate corresponding to the third signal; and
a reverse interpolation filter coupled to the timing recovery unit, wherein the reverse interpolation filter is operable to interpolate a second error signal at the first sample rate, which is a difference between the third signal and the partial response signal, to obtain the first error signal at the first sample rate for feeding back to the adaptive filter, and the reverse interpolation filter comprises:
a control unit operable to provide a first control signal that controls each sample interval at the first sample rate during which the interpolation of the second error signal occurs and a second control signal that identifies a timing offset within each sample interval at the first sample rate at which the interpolation of the second error signal occurs; and
a first interpolator operable to re-sample the second error signal at the first sample rate to obtain the first error signal at the first sample rate according to the first control signal and the second control signal.

2. The apparatus recited in claim 1, wherein the reverse interpolation filter is operable to interpolate the second error signal to obtain the first error signal using a Widrow-Hoff gradient descent algorithm.

3. The apparatus recited in claim 1, wherein the reverse interpolation filter is operable to interpolate the second error signal to obtain a sample of the first error signal for each sample interval at the first sample rate.

4. The apparatus recited in claim 1, wherein for each sample interval at the second sample rate:
the first control signal is either present or absent;
if the first control signal is present, then the first interpolator is operable to perform one re-sampling of the second error signal; and
if the first control signal is absent, then the first interpolator is operable to perform two re-samplings of the second error signal.

5. The apparatus recited in claim 1, wherein the timing recovery unit comprises:
a numerically-controlled oscillator operable to provide a third control signal that controls each sample interval at the second sample rate during which the interpolation of the second signal occurs and a fourth control signal that identifies a timing offset within each sample interval at the first sample rate at which the interpolation of the second signal occurs;
a second interpolator operable to re-sample the second signal at the first sample rate to obtain the third signal at the second sample rate according to the third control signal and the fourth control signal; and
a slicer operable to estimate the partial response signal at the second sample rate corresponding to the third signal.

6. The apparatus recited in claim 5, wherein the timing recovery unit further comprises:
a phase detector operable to provide a phase error signal that characterizes a phase difference between the third signal and the partial response signal; and
a loop filter operable to smooth the phase error signal.

7. The apparatus recited in claim 5, wherein:
the first sample rate is a higher sample rate,
the second sample rate is a lower sample rate,
the first interpolator is an up-sampling interpolator, and
the second interpolator is a down-sampling interpolator.

8. The apparatus recited in claim 5, wherein the second interpolator and the first interpolator are of the same type of interpolator.

9. The apparatus recited in claim 1, wherein:
the adaptive filter is a fractionally-spaced equalizer; and
the timing recovery unit is a interpolated timing recovery unit.

10. A method, comprising:
filtering, by an adaptive filter having adaptive filter coefficients that are adjusted based on a first error signal at a first sample rate, a first signal at the first sample rate to obtain a second signal at the first sample rate;
interpolating, by a timing recovery unit, the second signal at the first sample rate to obtain a third signal at a second sample rate;
estimating, by the timing recovery unit, a partial response signal at the second sample rate corresponding to the third signal; and
interpolating, by a reverse interpolation filter, a second error signal at the first sample rate, which is a difference between the third signal and the partial response signal, to obtain the first error signal at the first sample rate for feeding back to the adaptive filter, comprising:
providing, by a control unit of the reverse interpolation filter, a first control signal that controls each sample interval at the first sample rate during which the interpolation of the second error signal occurs and a second control signal that identifies a timing offset within each sample interval at the first sample rate at which the interpolation of the second error signal occurs; and
re-sampling, by a first interpolator of the reverse interpolation filter, the second error signal at the first sample rate to obtain the first error signal at the first sample rate according to the first control signal and the second control signal.

11. The method recited in claim 10, wherein interpolating the second error signal to obtain the first error signal uses a Widrow-Hoff gradient descent algorithm.

12. The method recited in claim 10, wherein interpolating the second error signal to obtain the first error signal comprises interpolating the second error signal to obtain a sample of the first error signal for each sample interval at the first sample rate.

13. The method recited in claim 10, wherein for each sample interval at the second sample rate:
   the first control signal is either present or absent;
   if the first control signal is present, then performing, by the first interpolator, one re-sampling of the second error signal; and
   if the first control signal is absent, then performing, the first interpolator, two re-samplings of the second error signal.

14. The method recited in claim 10, further comprising:
   providing, by a numerically-controlled oscillator of the timing recovery unit, a third control signal that controls each sample interval at the second sample rate during which the interpolation of the second signal occurs and a fourth control signal that identifies a timing offset within each sample interval at the first sample rate at which the interpolation of the second signal occurs;
   re-sampling, by a second interpolator of the timing recovery unit, the second signal at the first sample rate to obtain the third signal at the second sample rate according to the third control signal and the fourth control signal; and
   estimating, by a slicer of the timing recovery unit, the partial response signal at the second sample rate corresponding to the third signal.

15. The method recited in claim 14, further comprising:
   providing, by a phase detector of the timing recovery unit, a phase error signal that characterizes a phase difference between the third signal and the partial response signal; and
   smoothing, by a loop filter of the timing recovery unit, the phase error signal.

16. The method recited in claim 14, wherein:
   the first sample rate is a higher sample rate,
   the second sample rate is a lower sample rate,
   the first interpolator is an up-sampling interpolator, and
   the second interpolator is a down-sampling interpolator.

17. The method recited in claim 14, wherein the second interpolator and the first interpolator are of the same type of interpolator.

18. The method recited in claim 10, wherein:
   the adaptive filter is a fractionally-spaced equalizer; and
   the timing recovery unit is a interpolated timing recovery unit.

* * * * *